United States Patent [19]

Takekawa et al.

[11] Patent Number: 4,763,409
[45] Date of Patent: Aug. 16, 1988

[54] METHOD OF MANUFACTURING SEMICONDUCTOR DEVICE

[75] Inventors: Kouichi Takekawa; Manabu Bonkohara, both of Tokyo, Japan

[73] Assignee: NEC Corporation, Tokyo, Japan

[21] Appl. No.: 899,896

[22] Filed: Aug. 25, 1986

[30] Foreign Application Priority Data

Aug. 23, 1985 [JP] Japan .................................. 60-186061
Dec. 20, 1985 [JP] Japan .................................. 60-288786

[51] Int. Cl.$^4$ ............................................ H01R 43/00
[52] U.S. Cl. ................................... 29/827; 174/52 FP;
228/180.2; 357/70; 437/8
[58] Field of Search ...................... 357/70; 324/158 F;
174/52 FP; 228/180.2; 29/574, 827

[56] References Cited

U.S. PATENT DOCUMENTS 2,795,043  3/1974  Forlani ................................... 29/574
3,678,385  7/1972  Bruner .............................. 324/158 F
3,777,365 12/1973  Umbaugh .................... 174/52 FP X
3,793,719  2/1974  Bylander ............................ 357/70 X
3,838,984 10/1974  Crane et al. ................. 228/180.2 X
3,859,718  1/1975  Noe ............................... 228/180.2 X
4,026,008  5/1977  Drees et al. ........................... 29/574
4,411,719 10/1983  Lindberg .......................... 29/574 X Primary Examiner—Howard N. Goldberg
Assistant Examiner—Carl J. Arbes
Attorney, Agent, or Firm—Burns, Doane, Swecker & Mathis

[57] ABSTRACT

A method of manufacturing a semiconductor device employing a film carrier tape during process steps thereof is disclosed. Any test pad is not provided in the film carrier tape. Therefore, the semiconductor element carried in the film is cut at the leads and separated from the film carrier tape without conducting any electrical test. The separated semiconductor element is conducted the electrical test by installing it on a testing substrate which is provided to adapt to a large number of terminals.

14 Claims, 5 Drawing Sheets

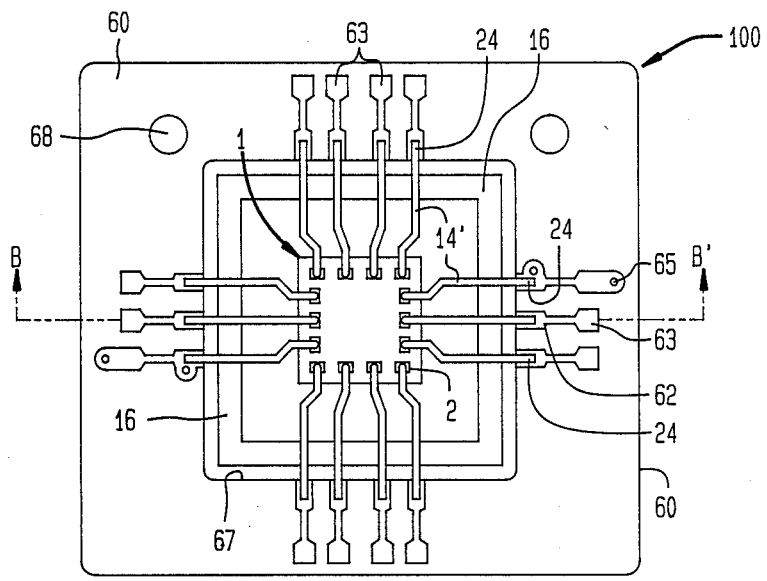
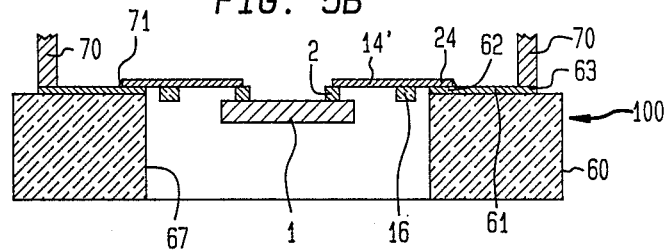
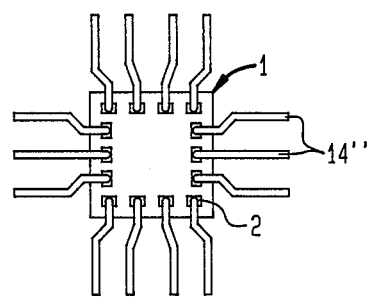

METHOD OF MANUFACTURING SEMICONDUCTOR DEVICE

BACKGROUND OF THE INVENTION

The present invention relates to a method of manufacturing a semiconductor device and particularly, to the method employing a film carrier tape during process steps thereof.

The film carrier tape for semiconductor chips is widely used in manufacture of semiconductor devices, in which a plurality of bonding pads of each semiconductor chip (semiconductor element) are simultaneously bonded to a plurality of leads formed on the film carrier tape of a plastic material such as polyimide.

The prior art film carrier tape has a plurality of test pads thereon which are connected to respective leads. After the bonding of the bonding pads to the leads are completed, electrical tests are conducted by contacting probes of a test apparatus to the test pads on the film carrier tape to evaluate the characteristics of the semiconductor element as well as the bonding conditions. Also, a bias test is conducted by applying power voltages such as Vcc, Vss or ground to the corresponding test pads for 4 to 24 hours at a temperature of 100° C. to 150° C.

It is a recent trend that the number of bonding pads on the semiconductor element is remarkably increased due to the enhancement of the circuit integration density in the semiconductor element. The increase in the number of the bonding pads brings about an increase in the number of the leads on the film carrier tape and as a result, a large number of test pads must be formed on the film carrier tape. In order that an increased number of the test pads may be provided in the limited space of the carrier tape, an area of each test pad must be reduced. However, the size of each test pad cannot be made less than 1.5 mm×1.5 mm square to maintain accurate contact with the probes of the test apparatus in view of the deformation of the carrier tape under the environment of the high temperature in the bias test and the tolerance of the alignment between the test pads and the test probe or test electrodes.

To solve the problem, the space of the carrier tape for the test pads must be enlarged. This may be done by either increasing a unit length of the carrier tape assigned to each semiconductor element or expanding the width of the tape. However, the former method increases a length of the lead from the bonding pad of the semiconductor element to the test pad, resulting in an increase in the electric resistance of the lead thereby to exert unfavorable influences upon the test. According to the latter method, on the other hand, the test apparatus or the fabricating apparatus have to be remade to have the standards suited for a new tape width. Because the usual width of the film carrier tape is 35 mm which is the same as the width of a movie film.

Further, the increase in the power consumption of the semiconductor element makes it necessary to adopt counter-measures for the heat dissipation in the semiconductor element. It is, however, very difficult to add radiating plates or fins to the film carrier tape for heat dissipation, thus raising still another problem that the influences of heat generation in the test or the like cannot be avoided.

SUMMARY OF THE INVENTION

Accordingly, an object of the present invention is to provide a method of manufacturing a semiconductor device using a film carrier tape during process steps, in which electrical tests including the bias test can be accurately and reliably conducted.

According to a feature of the present invention, there is provided a method of manufacturing a semiconductor device which comprises the steps of preparing a film carrier tape which includes a plastic tape having a plurality of holes, for accommodating respective semiconductor elements and a suspending strip portion provided in each hole and connected with the main frame portion of the film carrier tape and a plurality of groups of leads formed on the plastic tape such that one ends of the leads of each group are positioned within each hole of the plastic tape and the other ends, crossing the suspending strip portion in that hole, are extended to the main frame portion of the tape where the leads are electrically connected in common, bonding the one ends of the leads to bonding pads, respectively, of a semiconductor element provided in the hole of the plastic tape, cutting the leads away from the main frame portion of the plastic tape with the semiconductor element bonded thereto and with the suspending strip portion fixed thereto to maintain positional relationship of the leads such that the other ends of the leads are protruded beyond the suspending strip portion, preparing a testing substrate having a hole or a recess to accommodate the semiconductor element therein and a plurality of electrical conductors provided thereon with first portions locating near the hole or the recess and second portions attaching the other ends of the leads to the respective first portions of the conductors on the testing substrate with the semiconductor element bonded to the leads being placed in the hole or the recess of the testing substrate, and performing electrical tests by contacting probes or electrodes of a test apparatus to the second portions of the conductors on the testing substrate. The combination structure of the testing substrate and the semiconductor element fixed to the substrate via the leads may be delivered to a customer before or after the electrical tests. The customer may conduct the electrical tests again even of the tests has been conducted before delivery. The customers cuts the leads away from the testing substrate and attaching the semiconductor element to a circuit board or the like by means of the remaining leads.

According to the present invention, any test pad is not necessary on the film carrier tape and the leads on the film carrier tape may have a narrow width of favorably 40 μm to 300 μm. Therefore, a large number of leads can be provided on the tape. On the other hand, test pads (second portions of the conductor) are formed on the testing substrate with a sufficiently large area. The testing substrate made of, for example, ceramics may have a larger thickness than the plastic film carrier tape and therefore is hardly deformed by a high temperature during the bias test. Further, a heat sink can be easily connected to the testing substrate and/or directly to the back surface of the semiconductor element when the power consumption of the semiconductor element is larger. Therefore, according to the present invention electrical tests including the bias test can be accurately and reliably conducted.

BRIEF DESCRIPTION OF DRAWING

FIG. 3, FIG. 4, and FIG. 5A are plan views showing an embodiment of the present invention in the order of manufacturing steps, and FIG. 5B is a cross-sectional view taken along line B–B' of FIG. 5A.

FIG. 6 is a plan view showing a semiconductor element after separated from the testing substrate.

DESCRIPTION OF THE PRIOR ART

Figure 1:
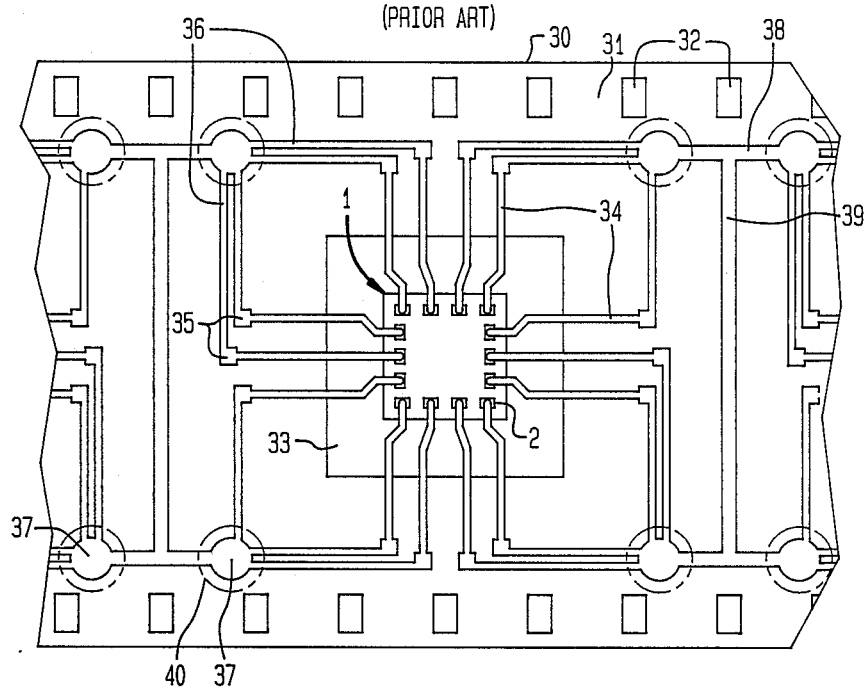
FIG. 1 is a plan view of a part of a prior art film carrier tape and a semiconductor element bonded thereto.
Figure 2:
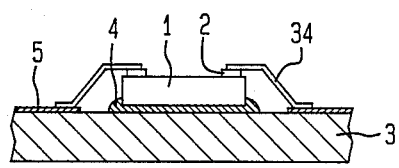
FIG. 2 is a cross-sectional view of a semiconductor element attached to a circuit board.

Referring to FIG. 1, a film carrier tape 30 of the prior art and a semiconductor element 1 are disclosed. The film carrier tape comprises a plastic tape 31 of polyimide having 127 μm thickness and a metal pattern selectively formed from a metal foil such as a copper foil through an etching process and adherent to the upper surface of the polyimide tape 31. The polyimide tape has a long elongated shape with the constant width and a plurality of sprocket performations 32 at both side sections in the width direction which are used to move the tape by moving means (not shown) such as a wheel and to set the tape at a predetermined position. Also, a plurality of holes 33 (only one hole is shown) are provided at the center section in the width direction in the polyimide tape with a constant interval in the lengthwise direction of the tape. Each hole accommodates a semiconductor element 1 therein. The metal pattern includes a plurality of leads 34 having 100 μm width and extended into the hole area where they are connected to bonding pads 2 such as bumbed terminals of the semiconductor element 1 by the thermocompression bonding simultaneously (gang bonding). Test pads 35 of 1.5 mm × 1.5 mm square are provided and connected to other ends of the respective leads 34. The metal pattern further includes centralizing portions 37, first connection wirings 36 connecting the test pads 35 and the centralizing portions 37, and second and third connection wirings 38, 39 connecting the centralizing portions, each other, all provided on a main frame portion of the tape 31. After necessary plating such as gold plating or tin plating process has been conducted on the metal pattern, openings shown in phantom circle 40 of a larger area than the centralizing portion 37 are formed through the plastic film 31 and the metal pattern therein to separate electrically the test pads each other. Thereafter, the semiconductor element 1 is bonded as mentioned above and electrical tests are conducted by contacting test probes (not shown) of a test apparatus to the respective test pads 35 on the polyimide tape 31. After testing, the leads 34 are cut at predetermined positions in the hole 33, and as shown in FIG. 2, the separated semiconductor element 1 is attached on a circuit board 3 or on a package by an eutectic material 4 or the like, and the leads 34 are bonded by well known method to wiring layers 5 on the circuit board or package or a lead frame (not shown) having external leads. Then, the structure is sealed with an epoxy resin (not shown) or the like. The first to third connector wirings are provided to connect all parts including leads and test pads in common and to make the plating treatment by the electrolytic method. THe centralizing portions 37 are provided to concentrate connection wirings and to separate easily the electrical connections of the test pads after plating.

DESCRIPTION OF THE EMBODIMENTS

Figure 3:
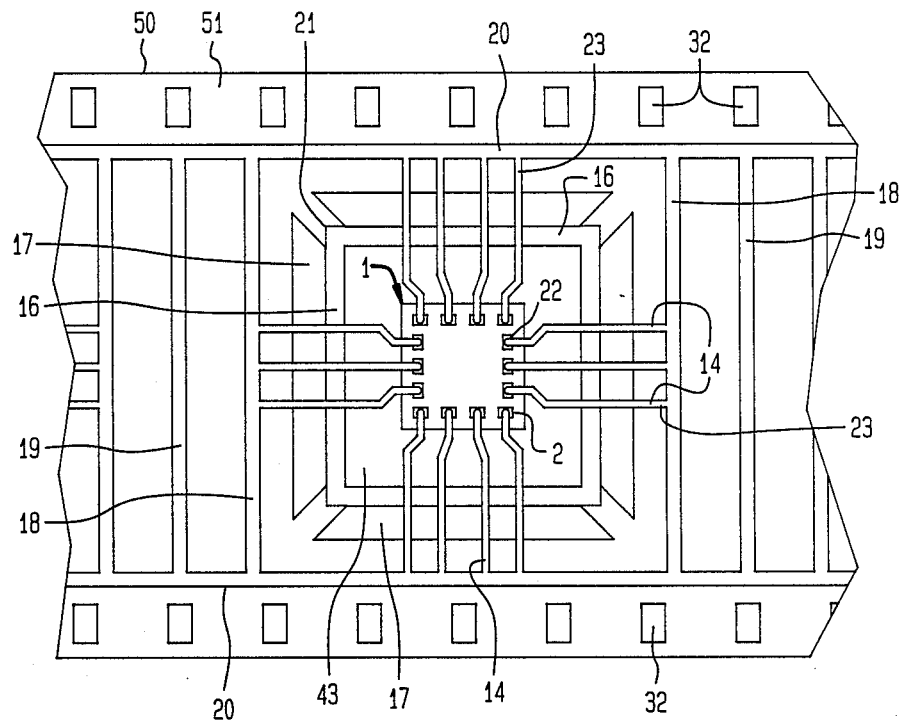

In FIGS. 3 to 7, the same components as those in FIGS. 1 and 2 are indicated by the same reference numerals. Referring to FIG. 3, a film carrier tape 50 comprises a long plastic tape 51 such as a polyimide tape of 125 μm thick with a constant width of 35 mm, and a metal film pattern of copper foil attached to the plastic tape 51. In the plastic tape, a plurality of sprochet perforations 32 and a plurality of holes 43 (only one is shown) are formed as shown in FIG. 1. Four suspending strips 16 of a plastic material such as polyimide are provided in the hole 43, forming a rectangular ring, suspended to the main frame portion of the tape at its four corners and leaving four slits 17 at the periphery of the hole 43. The metal pattern includes a pair of first connector layers 20 extending on the main frame portion of the tape in the lengthwise direction of the tape and on the both sides of the tape, pairs of second connector layers 18 each running in the widthwise direction of the tape on the opposite sides of each hole 43 and connected to the pair of the first connector layers at their two ends, and third conductor layers 19 each running between the adjacent pairs of the second conductor layers 18 in parallel therewith and connected to the pair of the first conductor layers 20, a plurality of groups of leads 14 of 40 to 300 μm width each extending from the first and second connector layers 20 and 18 into the hole 43, crossing the four slits 17 and four strips 16 and fixed to the four strips 16.

Plating process is conducted to the metal pattern by use of the first to third conductor layers 20, 18 and 19 as paths of plating current. Thereafter, a semiconductor element 1 having a plurality of bonding pads 2, that is, bump terminals is installed in the hole 43. Then, one ends 22 of the group of leads 14 are simultaneously bonded to respective bonding pads 2 of the semiconductor element 1 by gang bonding technique. Next, without any electrical test, the leads 14 and the strips 16 are cut at the slots 17 and along the dotted line 21, respectively, away from the main frame portion of the polyimide tape. At this time, the other ends 23 of the leads 14 are kept connected to the first and second connector layers 20 and 18. After the cutting process mentioned above, a structure shown in FIG. 4 is obtained. More particularly, the shortened leads 14' bonded at their one ends 22 to the bonding pads 2 of the semiconductor element 1 are attached to the suspending ring 16 of the tape and their other ends 24 are protruded from the suspending ring 16.

Figure 4:
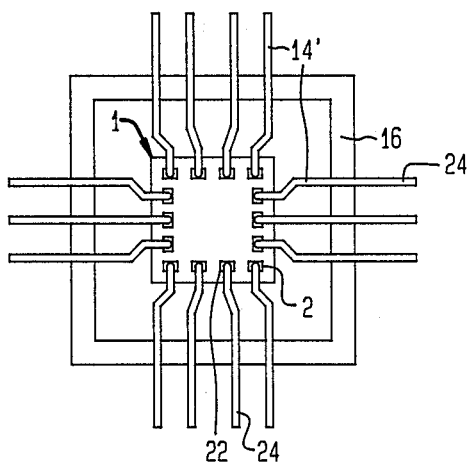
Figure 7A:
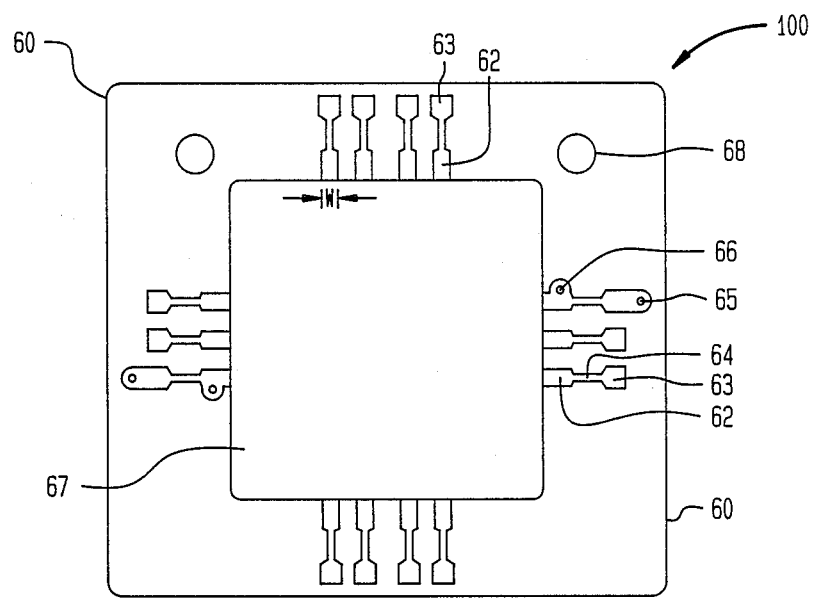
FIG. 7A and FIG. 7B are a top plan view and a back plan view, respectively, of a test substrate used in the embodiment.
Figure 7B:
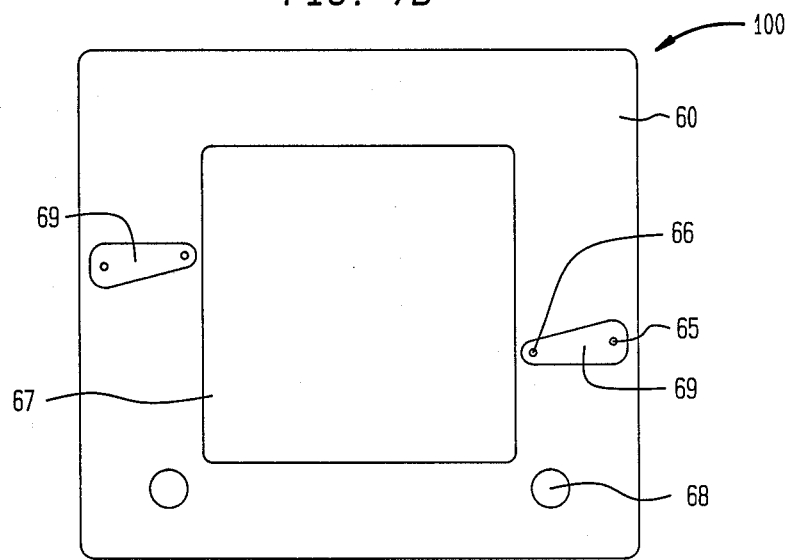

The structure shown in FIG. 4 is installed in a testing substrate 100 shown in FIGS. 7A and 7B. Referring to FIGS. 7A and 7B, the testing substrate 100 comprises a insulator body 60 and a metal pattern on the insulator body. The insulator body may be made of ceramic such as alumina ($Al_2O_3$) or resin material and have a thickness of 1 mm or more. Therefore, the substrate 100 is hardly deformed in the high temperature environment. At the center of the body, a device setting portion 67 is provided which is a square or rectangular hole or recess 67 to accommodate the semiconductor element to be tested. Two small circular holes 68 are further provided for setting the test substrate 100 at a predetermined position and for transferring the test substrate. As shown in FIG. 7A, the upper surface of the body 60 at the periphery of the device setting portion 67 has the metal pattern including a plurality of terminals 62 of 200 to 500 μm width (W), a plurality of test pads 63 each having a size of 0.8 mm×0.8 mm to 1.0 mm×1.0 mm square and connected to each terminal 62 through a connecting path 64. The size of the test pad 63 on the insulator body 60 may be smaller than that of the test pad 35 on the prior art polyimide tape 31 shown in FIG. 1, because the insulator body of the testing substrate 100 is hardly deformed as mentioned above. Therefore, a larger number of test pads can be provided. The terminal 62, connecting path 64 and test pad 63 are continuously formed by metallized pattern on the ceramic body or by metal foil pattern on the resin body. Some terminals and test pads to which power sources such as Vcc, Vss or ground voltage are applied have small throughholes 65 and 66 as shown in FIG. 7A, through which a metallized area 69 formed on the back surface of the insulator body 60 as shown in FIG. 7B is electrically connected. Namely, the holes 65, 66 are filled with conductive material (not shown), and therefore the test pad 63 an the terminal 62 are connected to the metallic member 69 to remarkably reduce the electrical resistance between the test pad 63 and the terminal 62 even if the distance therebetween is large.

Returning to FIGS. 5A and 5B, the semiconductor element 1 is installed in the device setting portion 67 of the testing substrate 100, and the leads 14 are connected to the terminals 62 by solder 71 at their ends 24, respectively. Then, electrical tests including the bias test are conducted by contacting test probes or test electrodes 70 of a test apparatus (not shown) to the respective test pads 63 on the insulator body 60 of the testing substrate 100. After the electrical tests, the structure shown in FIG. 5A is delivered to a customer. The customer may perform the electrical tests again, and cuts the leads 14' at desired position between the semiconductor element 1 and the edge of the device setting portion 67 to obtain a semiconductor device, as shown in FIG. 6, with a plurality of further shortened leads 14" bonded to the bump terminals 2 of the semiconductor element 1 at their one ends and extending outwardly from the semiconductor element. The semiconductor device shown in FIG. 6 can be installed on a circuit board as shown in FIG. 2, on a ceramic package, or on a lead frame.

Figure 8:
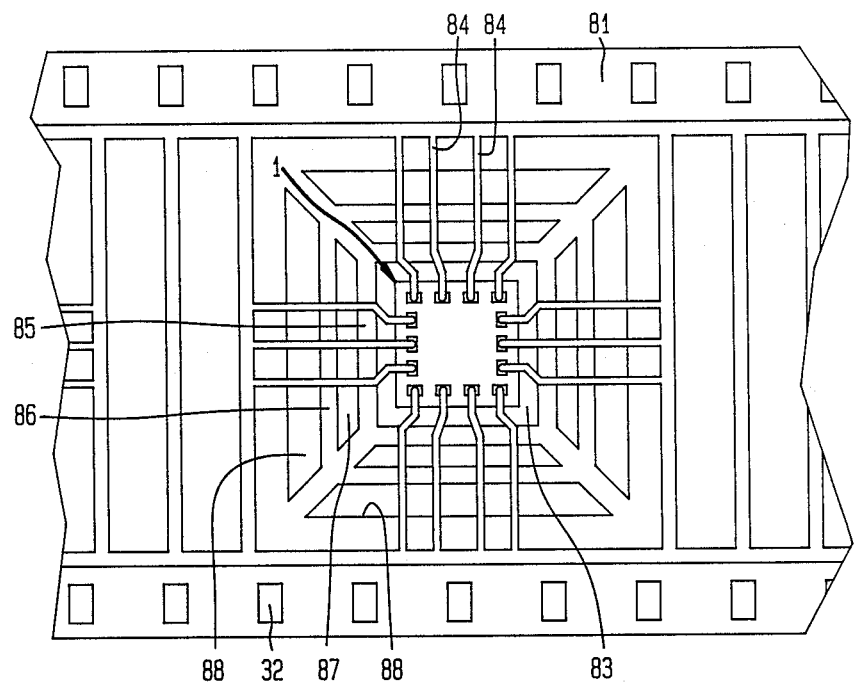
FIG. 8 is a partial plan view showing another embodiment of the present invention.
Figure 9:
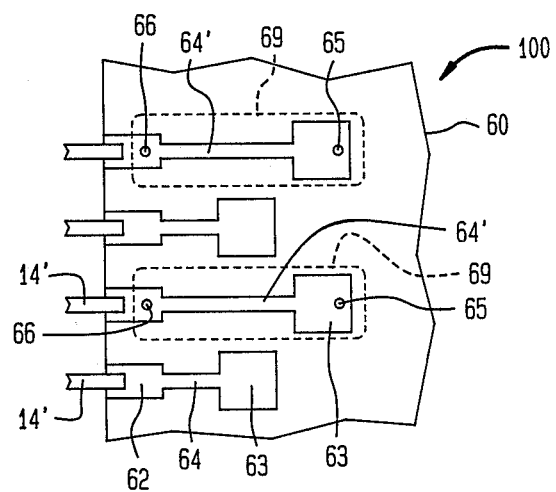
FIG. 9 is a partial plan view showing a modification of the testing substrate.

Referring to FIG. 8 in which the same components as those in FIGS. 1 to 5 are indicated by the same reference numerals, another embodiment, where leads 84 are long, has a plastic tape 81 provided with double suspending strips 85 and 86 and double slots 87 and 88 in a hole 83. After, separation from the film carrier tape, the holdability of the leads can be improved. Further in this case, the inner suspending strip 85 can be left with the leads and the semiconductor device can be installed on the circuit board or the like with the inner suspending strip 85. Referring to FIG. 9, a larger number of test pads 63 can be provided by arranging them in two or more columns. In FIG. 9, the same components as those in FIGS. 5A, 5B, 7A, 7B are indicated by the same reference numerals. In this case, longer connecting paths 64' has high electrical resistances. Therefore, corresponding test pad and terminal are connected by the metallic layer 69 on the back face via the through holes 65, 66 as described above with reference to FIGS. 7A and 7B. Thus, a larger number of test pads can be provided without unfavorable enhancement of the electrical resistance.

What is claimed is:

1. A method of manufacturing a semiconductor device comprising the steps of
    preparing a film carrier tape, said film carrier tape including a plastic tape and a plurality of leads formed on and fixed to the surface of said plastic tape, said plastic tape having a plurality of holes, each of said leads being extended to a corresponding hole at one of its ends and electrically connected in common to the other leads at its other end,
    placing a semiconductor element having a plurality of bonding pads thereon in one of said holes of said plastic tape, bonding said one end of each of said leads to said bonding pads of said semiconductor element,
    cutting said leads at said hole, removing said semiconductor element with the cut leads coupled thereto from said hole of said plastic tape,
    preparing a testing substrate, said substrate including an insulator body having a device setting portion, a plurality of terminals provided at a periphery of said device setting portion and on the upper surface of said insulator body, and a plurality of test pads electrically connected to respective ones of said terminals,
    setting said semiconductor element in said device setting portion of said testing substate, electrically connecting said leads coupled to said semiconductor element to said terminals, respectively, by solder, conducting an electrical test by contacting test probes of a test apparatus to said test pads of said testing substrate, and delivering to a customer said semiconductor element with said testing substrate to which said semiconduct element is fixed.

2. A method of claim 1, in which said plastic tape has a suspending strip in said hole which is fixed to said leads and said leads are cut such that said suspending strip is maintained fixed to the leads coupled to said semiconductor element.

3. A method of claim 2, in which said suspending strip is provided so as to substantially form a rectangular ring in said hole, and said leads cross the four sides of said ring in extending into said hole.

4. A method of claim 1, in which a terminal of said testing substrate and a respective test pad of said testing substrate are electrically connected through a connecting path formed on said upper surface of said insulator substrate.

5. A method of claim 1, in which a terminal of said testing substrate and a respective test pad of said testing substrate are electrically connected by means of a metallic member provided on a back surface of said insulator body and through holes which are provided in said terminal and said test pad and which connect said terminal and said test pad to said metallic member, respectively.

6. A method of claim 1, in which said test pads are arranged in two or more columns on said insulator body of said testing substrate.

7. A method of manufacturing a semiconductor device comprising the steps of
    preparing a film carrier tape, said film carrier tape including a plastic tape and a plurality of leads formed on and fixed to the surface of said plastic tape, said plastic tape having a plurality of holes, each of said leads being extended to a corresponding hole at one end and electrically connected in common to the other leads at its other end, placing a semiconductor element having a plurality of bonding pads thereon in one of said holes of said plastic tape, bonding said one end of each of said leads to said bonding pads of said semiconductor element, cutting said leads at said hole, removing said semiconductor element with the cut leads coupled thereto from said hole of said plastic tape, preparing a testing substrate, said testing substrate including an insulator body having a device setting portion and upper and back surfaces, a plurality of terminals provided at a periphery of said device setting portion, arranged in one direction and on said upper surface of said insurlator body, a plurality of test pads provided on said upper surface of said insulator body, a first group of said test pads being arranged in a first column in parallel with the arrangement of said terminals and a second group of said test pads being arranged in a second column in parallel with said arrangement of said terminals and father from said arrangement of said terminals than said first column, a plurality of connecting paths formed on said upper surface of said insulator body, having the narrower width than that of said test pad and electrically connecting respective ones of said terminals and respective ones of said test pads belonging to said first and second groups, and a plurality of metallic members provided on said back surface of said insulator body, said metallic members being electrically connected to respective ones of said test pads belonging to said second group and respective ones of said terminals via through holes provided in said insulator body such that each of said test pads belonging to said second group is electrically connected to the corresponding terminal through said connecting path on said upper surface of said insulator body and through said metallic member on said back surface of said insulator body, setting said semiconductor element in said device setting portion of said testing substrate, electrically connecting said leads coupled to said semiconductor element to said terminals, respectively, and conducting an electrical test by contacting test probes of a test apparatus to said test pads of said testing substrate.

8. The method of claim 7, in which said plastic tape has a suspending strip in said hole which is fixed to said leads and said leads are cut such that such suspending strip is maintained fixed to the leads coupled to said semiconductor element.

9. The method of claim 2, in which said suspending strip is provided so as to substantially form a rectangular ring in said hole, and said leads cross the four sides of said ring when they extend into said hole.

10. A method of manufacturing a semiconductor device comprising the steps of
preparing a film carrier tape, said film carrier tape including a plastic tape and a plurality of leads formed on and fixed to the surface of said plastic tape, said plastic tape having a plurality of holes, and a plurality of suspending strips formed in said holes such that at least a slit at the periphery of said hole is provided, said leads being extended on said slit and being connected to said suspending strip, each of said leads extending to a corresponding hole at one end and being electrically connected in common to the other leads at its other end, placing a semiconductor element having a plurality of bonding pads thereon in one of said holes of said plastic tape, bonding said one end of each of said leads to said bonding pads of said semiconductor element, cutting said leads at said slit in said hole, removing said semiconductor element with the cut leads coupled thereto and fixed to said suspending strip from said hole of said plastic tape, preparing a testing substrate, said testing substrate including an insulator body having a device setting portion, a plurality of terminals provided at a periphery of said device setting portion and on the upper surface of said insulator body, and a plurality of test pads electrically connected to respective ones of said terminals, setting said semiconductor element in said device setting portion of said testing substrate, electrically connecting said leads coupled to said semiconductor element to said terminals, respectively, conducting an electrical test by contacting test probes of a test apparatus to said test pads of said testing substrate, and thereafter cutting said leads between said suspending strip and said semiconductor element to thereby remove said semiconductor element from said testing substrate.

11. The method of claim 10, in which said suspending strip is provided so as to substantially form a rectangular ring in said hole, and said leads cross the four sides of said ring while extending into said hole.

12. The method of claim 10, in which a terminal of said testing substrate and a test pad of said testing substrate are electrically connected through a connecting path formed on said upper surface of said insulator substrate.

13. The method of claim 10, in which a terminal of said testing substrate and a test pad of said testing substrate are electrically connected by means of a metallic member provided on a back surface of said insulator body and through holes which are provided in said terminal and said test pad and which connect said terminal and said test pad to said metallic member, respectively.

14. The method of claim 10, in which said test pads are arranged in at least two columns on said insulator body of said testing substrate.

* * * * *